United States Patent
Shin et al.

(10) Patent No.: US 8,623,727 B2
(45) Date of Patent: Jan. 7, 2014

(54) METHOD FOR FABRICATING SEMICONDUCTOR DEVICE WITH BURIED GATE

(75) Inventors: Jong-Han Shin, Gyeonggi-do (KR); Kyung-Bo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 35 days.

(21) Appl. No.: 13/326,810

(22) Filed: Dec. 15, 2011

(65) Prior Publication Data

US 2012/0156869 A1   Jun. 21, 2012

(30) Foreign Application Priority Data

Dec. 15, 2010   (KR) .......................... 10-2010-0128115

(51) Int. Cl.
*H01L 21/336* (2006.01)

(52) U.S. Cl.
USPC ................................... 438/270; 257/E21.585

(58) Field of Classification Search
USPC .......................................................... 438/270
See application file for complete search history.

(56) References Cited

U.S. PATENT DOCUMENTS

| | | | | |
|---|---|---|---|---|
| 7,332,397 | B2* | 2/2008 | Kim | 438/268 |
| 7,585,780 | B2* | 9/2009 | Kim | 438/725 |
| 2010/0330775 | A1* | 12/2010 | Shin et al. | 438/430 |

FOREIGN PATENT DOCUMENTS

| | | |
|---|---|---|
| JP | 2003-124309 | 4/2003 |
| KR | 1020060000910 | 1/2006 |
| KR | 1020060007692 | 1/2006 |
| KR | 1020080030385 | 4/2008 |

OTHER PUBLICATIONS

Notice of Allowance issued by the Korean Intellectual Property Office on May 17, 2012.

* cited by examiner

*Primary Examiner* — Charles Garber
*Assistant Examiner* — Reema Patel
(74) *Attorney, Agent, or Firm* — IP & T Group LLP

(57) ABSTRACT

A method for fabricating a semiconductor device includes forming a hard mask pattern over a substrate, forming an isolation layer for defining an active region by using the hard mask pattern, forming a buried gate in and across the active region and the isolation layer over the substrate, forming an inter-layer dielectric layer over the substrate, forming a storage node contact hole that exposes the hard mask pattern by selectively etching the inter-layer dielectric layer, extending the storage node contact hole to expose the active region by removing the hard mask pattern exposed under the storage node contact hole, and forming a storage node contact plug that fills the extended storage node contact hole.

17 Claims, 16 Drawing Sheets

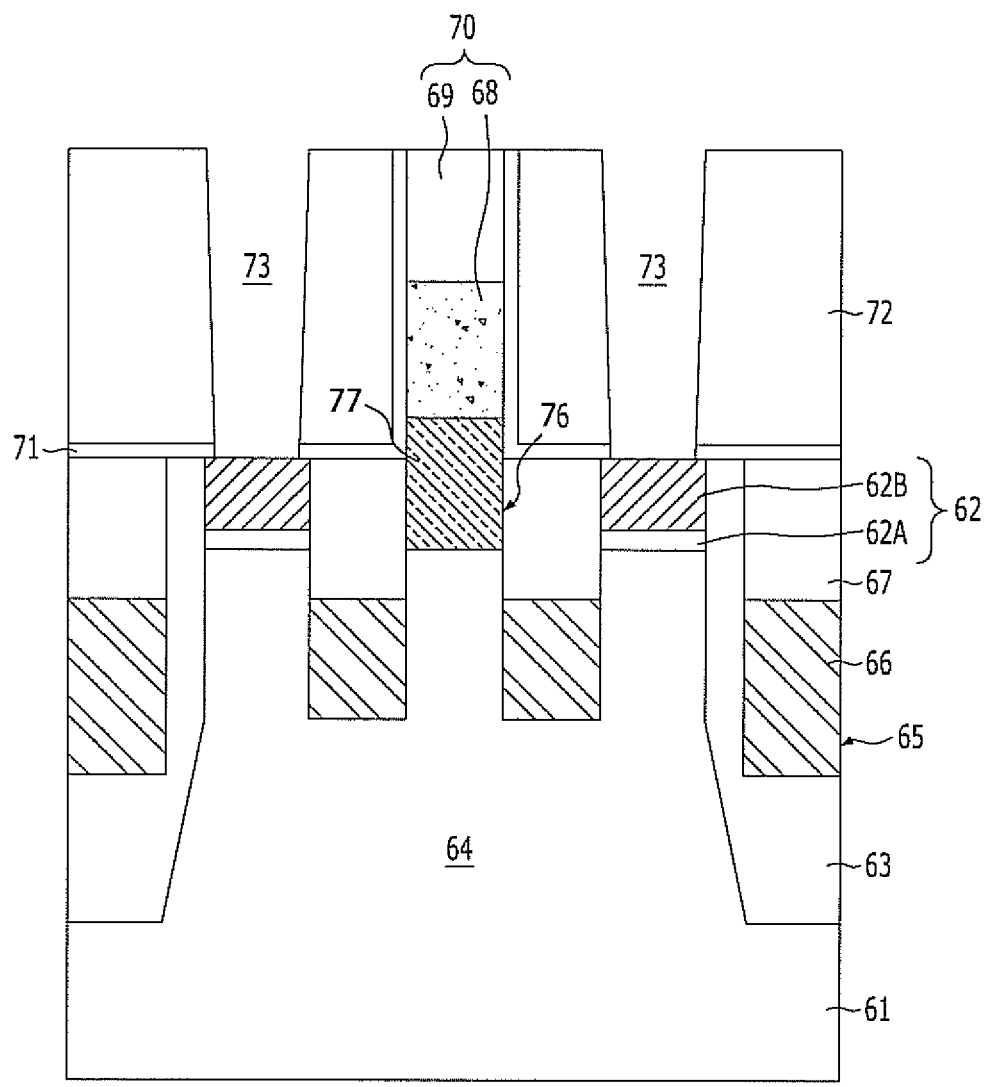

METHOD FOR FABRICATING SEMICONDUCTOR DEVICE WITH BURIED GATE

CROSS-REFERENCE TO RELATED APPLICATIONS

The present application claims priority of Korean Patent Application No. 10-2010-0128115, filed on Dec. 15, 2010, which is incorporated herein by reference in its entirety.

BACKGROUND

1. Field

Exemplary embodiments of the present invention relate to a semiconductor device fabrication technology, and more particularly, to a method for fabricating a semiconductor device with buried gates (BG).

2. Description of the Related Art

As the size of semiconductor devices becomes smaller, it becomes more difficult for the semiconductor devices to have diverse device properties and fabricate such the semiconductor devices. In particular, under the design rule of 40 nm or less, the semiconductor device reaches the technical limitations in forming a gate structure, a bit line structure, and/or a contact structure. Even if the structure is formed, desired device properties may not be obtained. Therefore, the technology of forming buried gates (BG) by burying gates in a substrate is being developed.

FIGS. 1A to 1C are cross-sectional views illustrating a method for fabricating a conventional semiconductor device including buried gates.

Referring to FIG. 1A, a hard mask pattern 12 including a pad oxide layer 12A and a hard mask polysilicon layer 12B stacked therein is formed over a substrate 11, and an isolation layer 13 for defining an active region 14 is formed using the hard mask pattern 12.

Referring to FIG. 1B, after the hard mask pattern 12 is removed, a cleaning process is performed. Subsequently, a conductive layer 15 for forming landing plugs is deposited over a groove from which the hard mask pattern 12 removed, and a planarization process is performed until the surface of the isolation layer 13 is exposed.

Referring to FIG. 1C, trenches 16 are formed by selectively etching the conductive layer 15, the active region 14, and the isolation layer 13, and at the same time, landing plugs 15A are formed. Buried gates are formed by sequentially forming a gate insulation layer (not shown) on the surface of the trenches 16, forming a gate electrode 17 that fills a portion of each trench 16, and a sealing layer 18 that fills the other portion of each trench 16.

Subsequently, an inter-layer dielectric layer 19 is formed over the substrate 11, and then storage node contact plugs 22, that is in contact with the landing plugs 15A by penetrating through the inter-layer dielectric layer 19, and bit lines 25, that are in contact with the landing plugs 15A and are buried in the inter-layer dielectric layer 19, are formed. In the drawing, the reference numeral 21 denotes storage node contact holes, and the reference numeral '23' denotes a damascene pattern. The reference numeral '24' denotes bit line spacers, and the reference numeral '26' denotes a sealing layer.

However, since the landing plugs 15A are formed before the bit lines 25 and the storage node contact plugs 22 are formed in the conventional semiconductor device, the landing plugs 15A may be lost in the course of forming the damascene pattern 23 and the storage node contact holes 21, thus increasing contact resistance.

Also, when the storage node contact holes 21 are formed, the landing plugs 15A are lost and thus a short circuit may occur between the storage node contact plugs 22 of the active region 14 and other active regions adjacent to the active region 14 in the longitudinal direction. This occurs because the conductive layer 15 for forming landing plugs fills the groove from which the hard mask pattern 12 is removed. To be specific, the height of the landing plugs 15A is decided based on the height H1 or H2 of the isolation layer 13 protruding from the substrate 11, and the isolation layer 13 protruding from the substrate 11 is lost during the removal process of the hard mask pattern 12, the cleaning process, and the planarization process that are carried out before the landing plugs 15A are formed, and as a result, the height of the isolation layer 13 is decreased (H1→H2).

The decrease in the height of the landing plugs 15A is caused by the loss of the isolation layer 13 and may be prevented by increasing the thickness of the hard mask pattern 12 in consideration of the height of the isolation layer 13 that is lost in the course of forming the conductive layer 15 for forming landing plugs. However, when the thickness of the hard mask pattern 12 is increased, the level of the process difficulty in forming isolation trenches for the isolation layer 13 is increased and at the same time process margin is decreased as well. Moreover, since the height of the active region 14 including the hard mask pattern 12 is increased when the isolation trenches are formed, the active region 14 may lean/slant.

SUMMARY

An embodiment of the present invention is directed to a method for fabricating a semiconductor device including buried gates that may prevent an increase in contact resistance resulting from the loss of landing plugs.

Another embodiment of the present invention is directed to a method for fabricating a semiconductor device including buried gates that may prevent a short circuit form occurring between storage node contact plugs and active regions.

Another embodiment of the present invention is directed to a method for fabricating a semiconductor device including buried gates that may prevent active regions from leaning during a process of forming an isolation layer.

In accordance with an embodiment of the present invention, a method for fabricating a semiconductor device includes: forming a hard mask pattern over a substrate; forming an isolation layer for defining an active region by using the hard mask pattern; forming a buried gate in and across the active region and the isolation layer over the substrate; forming an inter-layer dielectric layer over the substrate; forming a storage node contact hole that exposes the hard mask pattern by selectively etching the inter-layer dielectric layer; extending the storage node contact hole to expose the active region by removing the hard mask pattern exposed under the storage node contact hole; and forming a storage node contact plug that fills the extended storage node contact hole.

In accordance with another embodiment of the present invention, a method for fabricating a semiconductor device includes: forming a hard mask pattern over a substrate; forming an isolation layer for defining an active region by using the hard mask pattern; forming a buried gate in and across the active region and the isolation layer; forming a bit line contact hole by removing a first portion of the hard mask pattern; forming a bit line contact plug that fills the bit line contact hole; and forming a bit line over the bit line contact plug.

BRIEF DESCRIPTION OF THE DRAWINGS

FIGS. 3A to 3G are cross-sectional views illustrating a method for fabricating a conventional semiconductor device with buried gates in accordance with a second embodiment of the present invention.

DETAILED DESCRIPTION

Figure 1A:
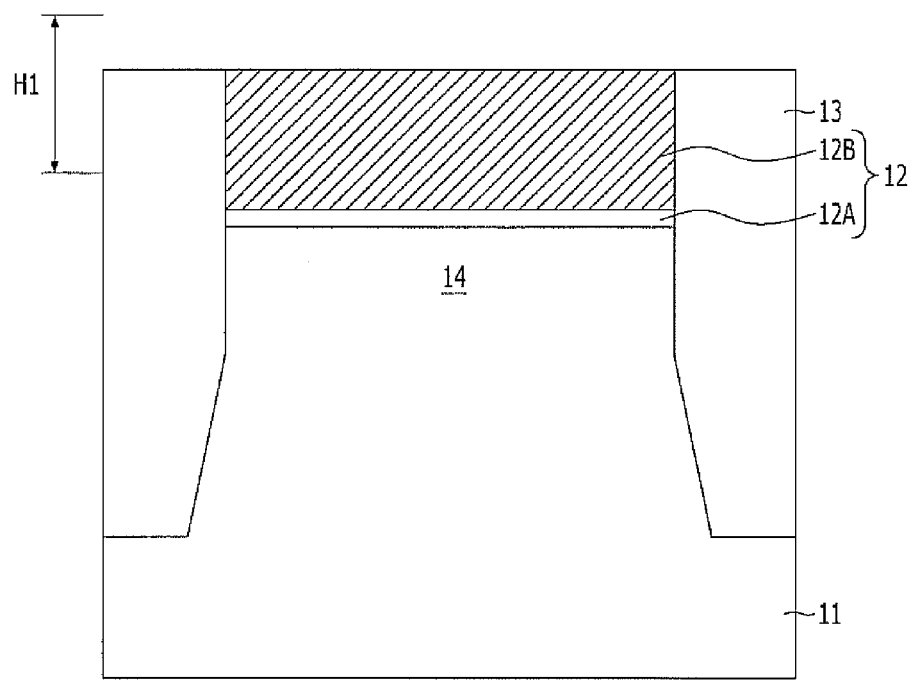
FIGS. 1A to 1C are cross-sectional views illustrating a method for fabricating a conventional semiconductor device with buried gates.
Figure 1B:
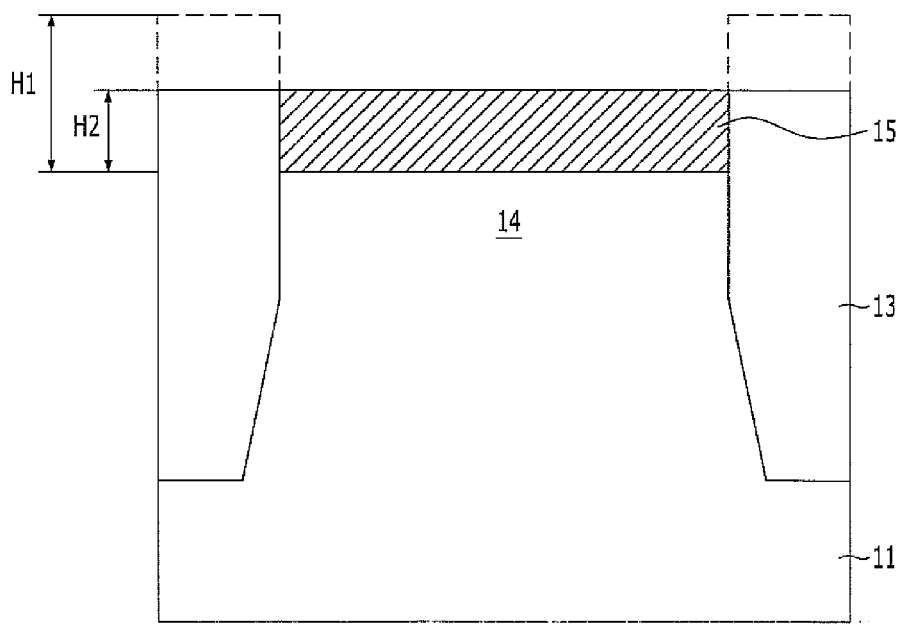
Figure 1C:
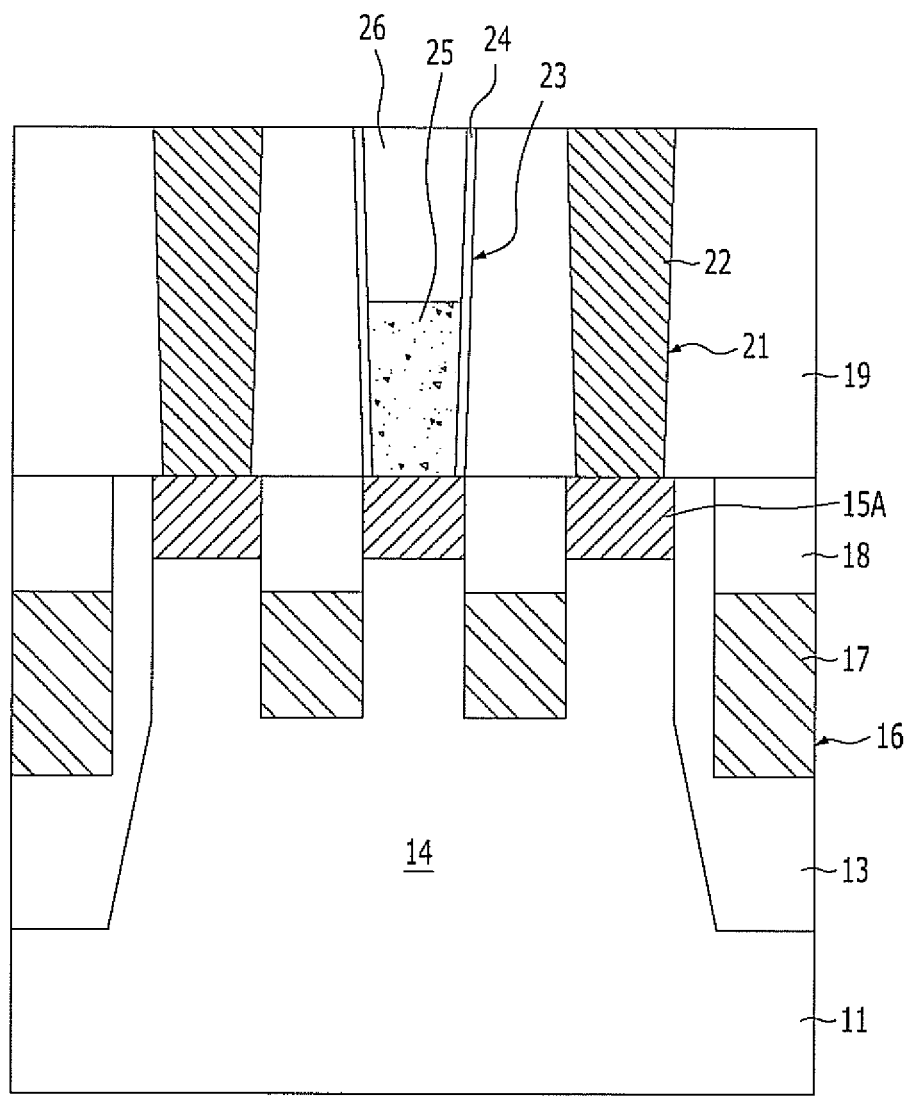

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Disclosed hereafter is a method for fabricating a semiconductor device with buried gates that may prevent an increase in contact resistance that results from the loss of landing plugs, prevent a short circuit from occurring between storage node contact plugs and active regions, and prevent active regions from leaning during a process of forming an isolation layer.

FIGS. 2A to 2I are cross-sectional views illustrating a method for fabricating a semiconductor device with buried gates in accordance with a first embodiment of the present invention.

Figure 2A:
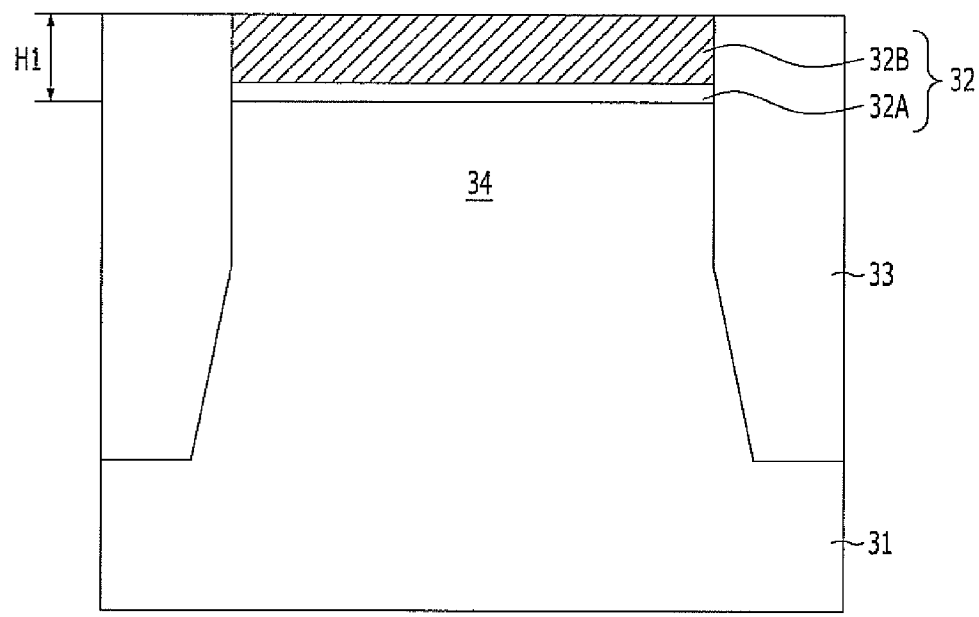
FIGS. 2A to 2I are cross-sectional views illustrating a method for fabricating a conventional semiconductor device with buried gates in accordance with a first embodiment of the present invention.

Referring to FIG. 2A, a hard mask pattern 32 including a pad oxide layer 32A and a hard mask polysilicon layer 32B stacked therein is formed over a substrate 31. The hard mask polysilicon layer 32B substantially functions as an etch barrier, and the pad oxide layer 32A enhances the adhesion between the hard mask polysilicon layer 32B and the substrate 31, e.g., a silicon substrate. Here, when a polysilicon thin film is directly formed over a silicon substrate, peeling of the polysilicon thin film may occur due to poor adhesion between the polysilicon thin film and the silicon substrate.

The hard mask pattern 32 may be formed to have such a thickness H1 that it may protect active regions 34 from leaning during a subsequent process of forming isolation trenches. Also, the hard mask pattern 32 may be formed to have such a thickness H1 that it may prevent another active region 34 adjacent to a storage node contact hole in the longitudinal direction of the active region 34 from being exposed during the subsequent process of forming the storage node contact holes. For example, the hard mask pattern 32 may be formed to have a thickness H1 ranging from approximately 600 Å to approximately 1500 Å.

Subsequently, isolation trenches for defining the active regions 34 are formed by using the hard mask pattern 32 as an etch barrier and etching the substrate 31, and then an isolation layer 33 is formed by filling the isolation trenches with an insulation material.

Figure 2B:
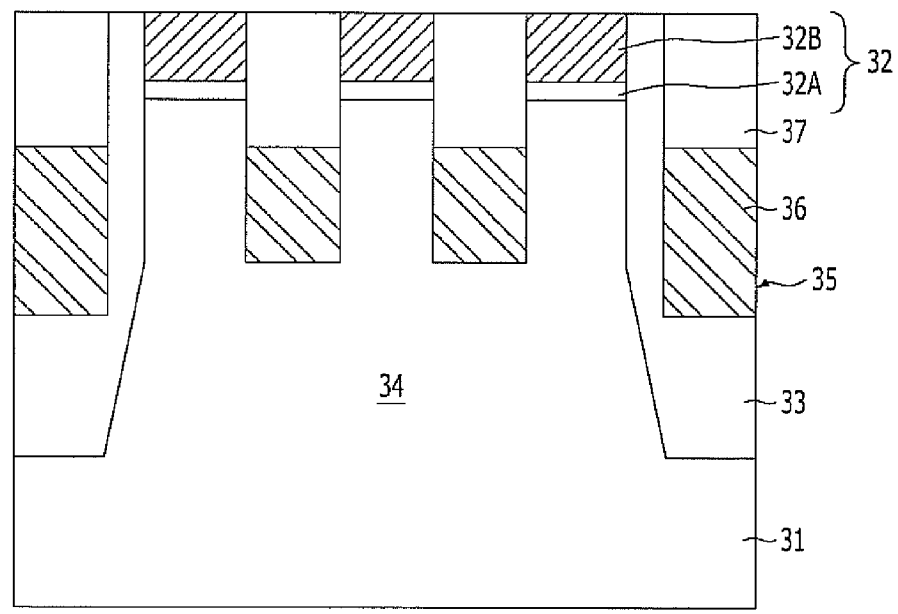

Referring to FIG. 2B, trenches 35 crossing the active regions 34 and the isolation layer 33 are simultaneously formed by selectively etching the hard mask pattern 32, the active regions 34, and the isolation layer 33. Here, the trenches 35 may be formed as a line-type pattern.

Subsequently, a gate insulation layer (not shown) is formed on the surface of the trenches 35, and then a gate electrode 36 filling a portion of each trench 35 is formed. Here, the gate electrode 36 may be a metallic layer including a metal layer, a metal oxide layer, a metal nitride layer, and/or a metal silicide layer.

Subsequently, a sealing layer 37 is formed over the gate electrode 36 to fill the other portion of each trench 35, and then a planarization process is performed until the hard mask pattern 32 is exposed.

Through the above-described process, buried gates including the trenches 35, the gate insulation layer (not shown), the gate electrode 36, and the sealing layer 37 may be formed. Here, the buried gates are formed in a cell region of the semiconductor device.

Figure 2C:
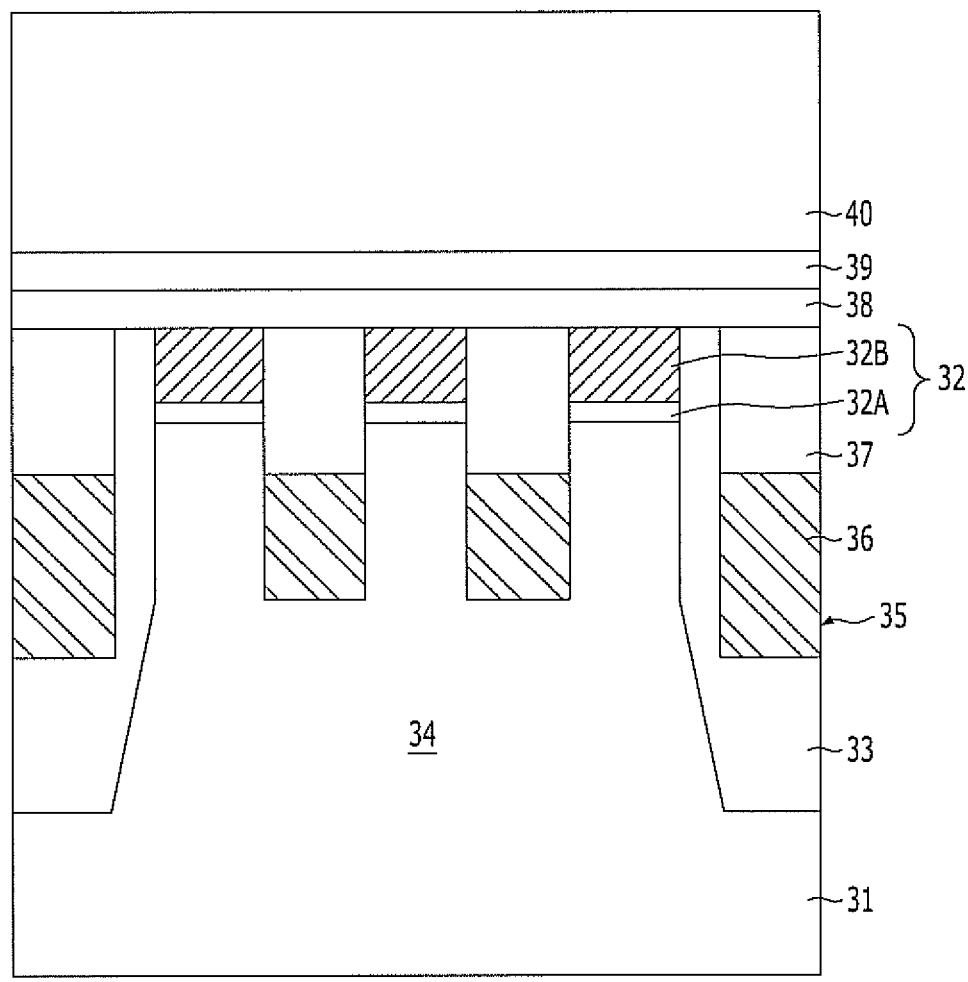

Referring to FIG. 2C, an etch stop layer 38 is formed over the substrate 31. The etch stop layer 38 protects the understructure from being damaged during a subsequent process of forming storage node contact holes and damascene pattern.

Subsequently, a capping layer 39 is formed over the etch stop layer 38. Although not illustrated in the drawing, after the formation of the capping layer 39, a peripheral gate is formed in a peripheral region. Here, the difference between floor levels of the cell region and the peripheral region may be prevented from being caused and stability of the peripheral gate formation process may be increased since the peripheral gate formation process is performed while landing plugs are not formed in the cell region. Here, when the landing plugs are formed in the cell region before the formation of the peripheral gate, the difference between the floor/bottom levels of the cell region and the peripheral region is caused due to the difference of pattern density. Such difference between the cell region and the peripheral region may destabilize operations in the subsequent process.

Subsequently, an inter-layer dielectric layer 40 is formed over the capping layer 39. Here, the inter-layer dielectric layer 40 may be formed to cover the entire surface of the substrate 31 and then a planarization process is performed until the upper surface of a peripheral gate (not shown) is exposed. The inter-layer dielectric layer 40 may be an oxide layer.

Figure 2D:
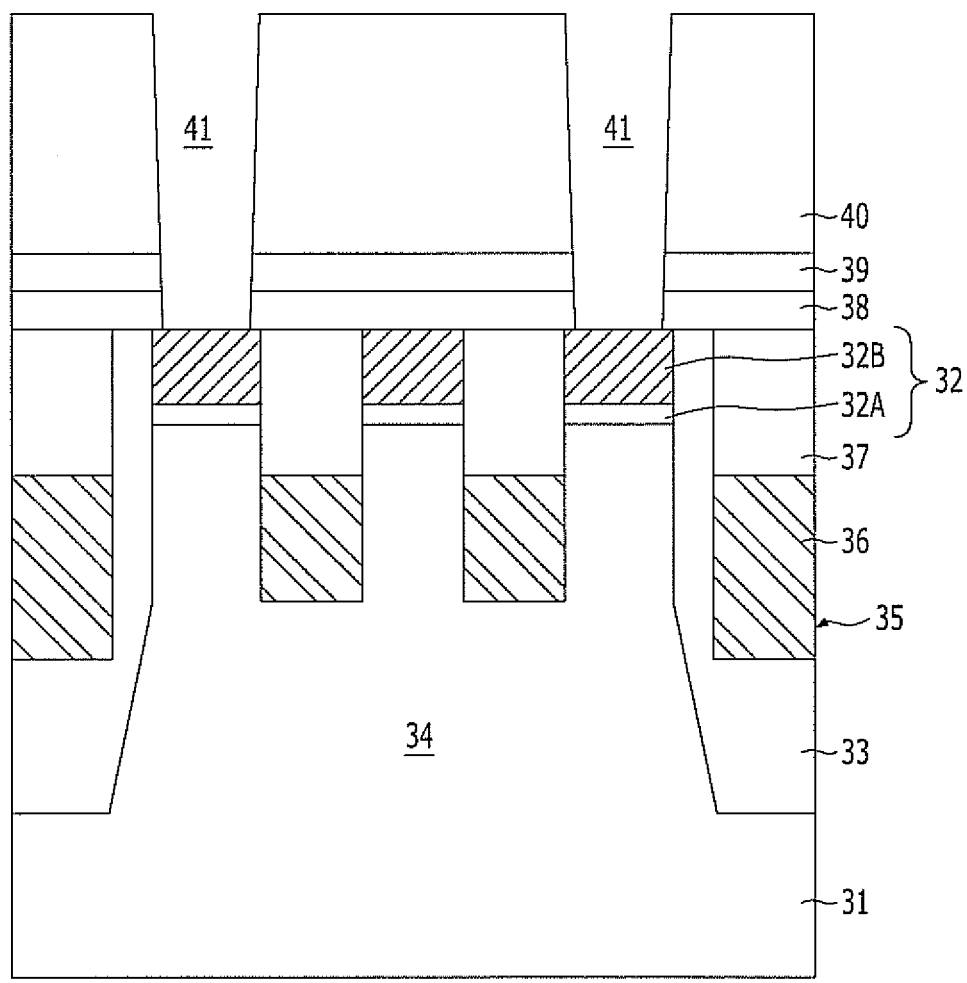

Referring to FIG. 2D, storage node contact holes 41 are formed to expose the hard mask pattern 32 by sequentially etching the inter-layer dielectric layer 40, the capping layer 39, and the etch stop layer 38. Here, since an over-etch process is performed to secure bottom critical dimension (CD) and prevent the occurrence of "contact not open", a portion of the hard mask pattern 32 may be lost.

The storage node contact holes 41 may be formed in any one shape selected from the group consisting of a hole type, a bar type, and a line type. Here, the bar type is a shape that exposes the upper portions of the edges of neighboring active regions 34 together.

Figure 2E:
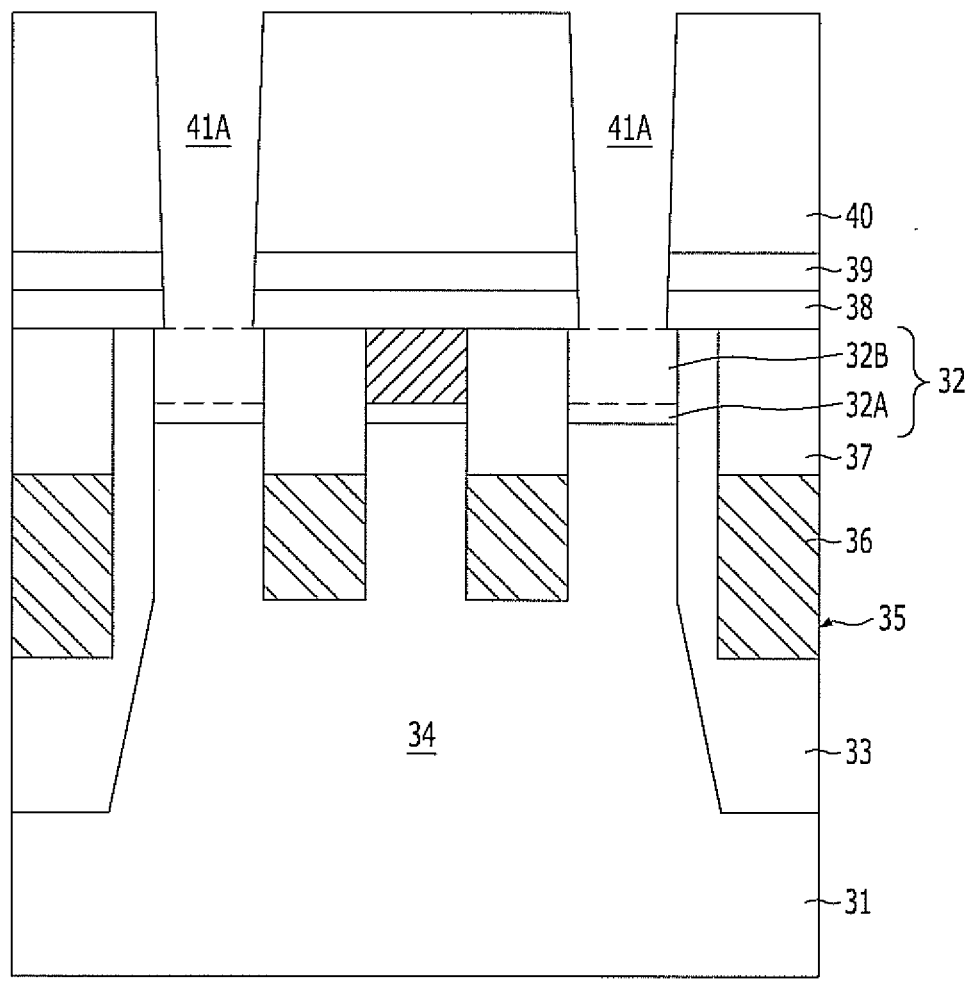

Referring to FIG. 2E, the active regions 34 are exposed by removing the hard mask pattern 32 under the storage node contact holes 41. Here, when the hard mask pattern 32 is removed, the pad oxide layer 32A and the hard mask polysilicon layer 32B may be removed individually to protect adjacent structures from being lost.

To be specific, the hard mask polysilicon layer 32B may be selectively removed through a dry etch process using a gas containing fluorine without damaging an adjacent structure. The pad oxide layer 32A may be removed through a dry etch process or a wet etch process. Here, when the pad oxide layer 32A is removed through a wet etch process, a protective layer (not shown) may be formed on the sidewalls of each storage node contact hole 41 in the form of spacers in order to prevent the sidewall of the storage node contact hole 41 from being deformed by an etch solution.

Hereafter, as the hard mask pattern 32 under the storage node contact holes 41 is removed, the reference numeral of the extended storage node contact holes is denoted with '41A'.

Figure 2F:
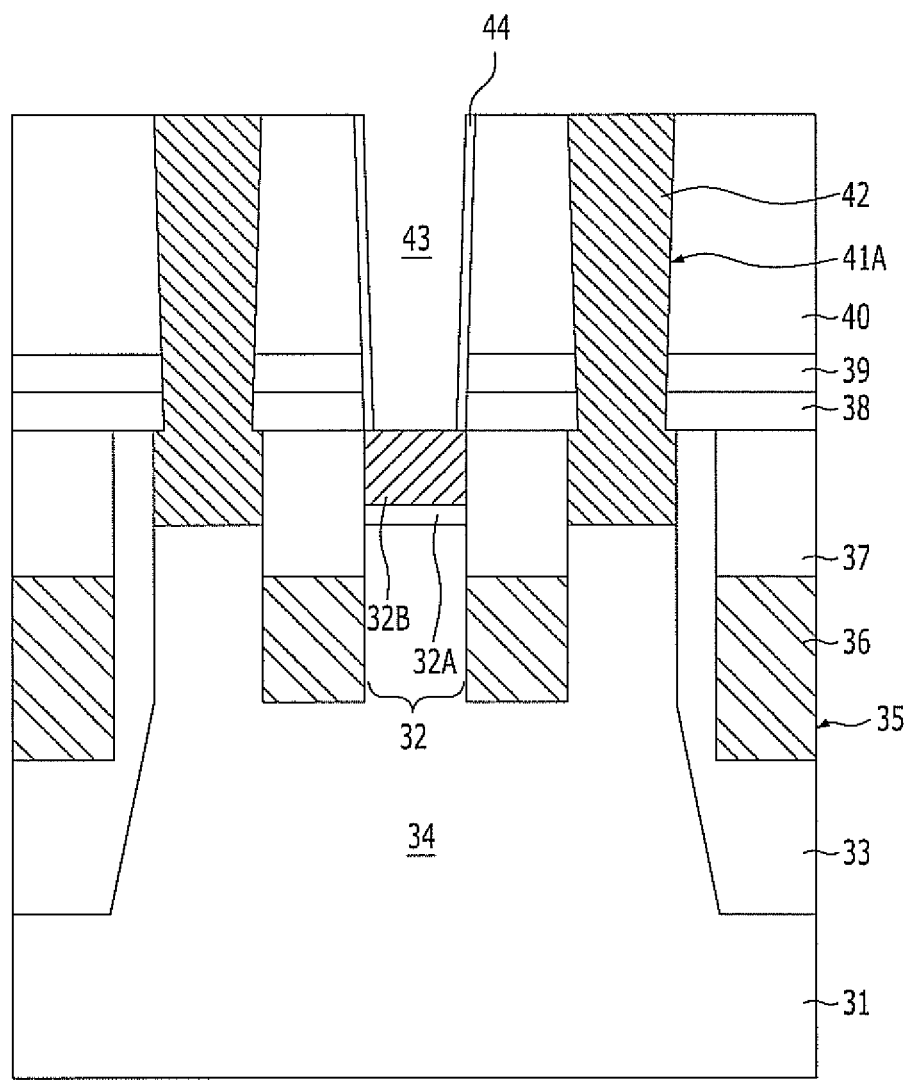

Referring to FIG. 2F, storage node contact plugs 42 having direct contact with the active regions 34 are formed by filling the extended storage node contact holes 41A with a conductive material. The storage node contact plugs 42 may be formed as a single layer by filling the extended storage node contact holes 41A with a silicon layer. Also, the storage node contact plugs 42 may be formed as a stacked layer by forming a silicon layer to fill a portion of each extended storage node contact hole 41A and then filling the other portion of the extended storage node contact hole 41A over the silicon layer with a metallic layer. Here, the silicon layer may be formed as a polysilicon layer or an epitaxial silicon (Si) layer through a Selective Epitaxial Growth (SEG) process.

Meanwhile, before the storage node contact plugs 42 are formed, an impurity may be ion-implanted into the active regions 34 exposed through the extended storage node contact holes 41A in order to decrease the contact resistance between the storage node contact plugs 42 and the active regions 34.

Subsequently, a damascene pattern 43 exposing the remaining hard mask pattern 32 is formed by selectively etching the inter-layer dielectric layer 40, the capping layer 39, and the etch stop layer 38. Here, as an over-etch process is performed to secure bottom CD and prevent the occurrence of "contact not open," a portion of the hard mask pattern 32 under the damascene pattern 43 may be lost. The damascene pattern 43 may be formed as a line pattern that is stretched in a direction crossing the buried gates.

Subsequently, bit line spacers 44 are formed on both sidewalls of the damascene pattern 43. The bit line spacers 44 may be formed through a series of processes of depositing an insulation layer along the surface of a structure and performing a blanket etch process, such as an etch-back process.

Figure 2G:
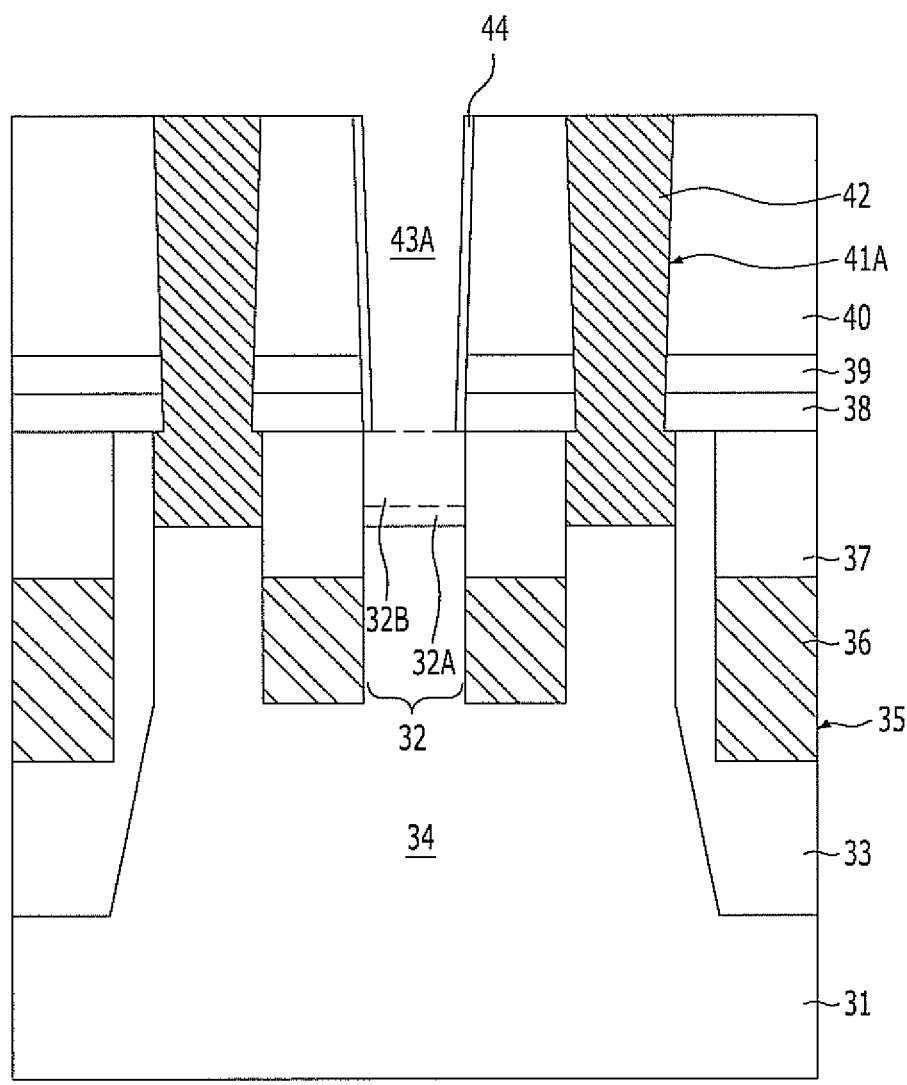

Referring to FIG. 2G, the active regions 34 are exposed by removing the hard mask pattern 32 under the damascene pattern 43. Here, when the hard mask pattern 32 is removed, the pad oxide layer 32A and the hard mask polysilicon layer 32B may be removed individually in order to protect the adjacent structures from being lost.

Hereafter, as the hard mask pattern 32 under the damascene pattern 43 is removed, the reference numeral of the extended damascene pattern is denoted with '43A', hereafter.

Figure 2H:
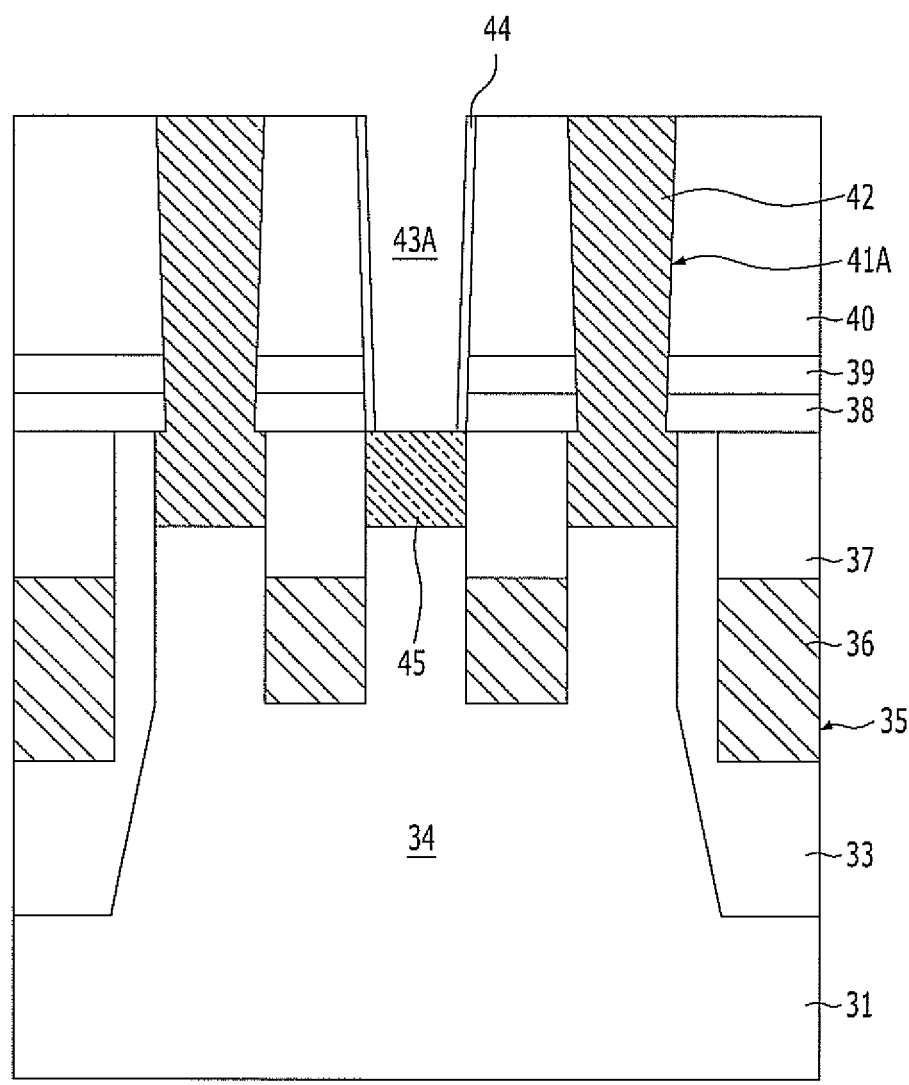

Referring to FIG. 2H, bit line contact plugs 45 filling a portion of the damascene pattern 43 and being in contact with the active regions 34 are formed. Here, the bit line contact plugs 45 may be formed of a silicon layer, and the silicon layer includes a polysilicon layer or an epitaxial silicon layer. When the bit line contact plugs 45 are of a polysilicon layer, the bit line contact plugs 45 may be formed by depositing a polysilicon layer and performing an etch-back process. When the bit line contact plugs 45 are of an epitaxial silicon layer, the bit line contact plugs 45 may be formed by performing a selective epitaxial growth process.

The bit line contact plugs 45 are formed before the formation of bit lines because the bit lines are typically formed of a metallic layer. To be specific, when the bit lines formed of a metallic layer have direct contact with the active regions 34, the metal material originating from the bit lines may diffuse into the substrate 31 and deteriorate the operation properties of the semiconductor device. Therefore, it is desirable to form the bit line contact plugs 45 before the bit lines are formed.

Figure 2I:
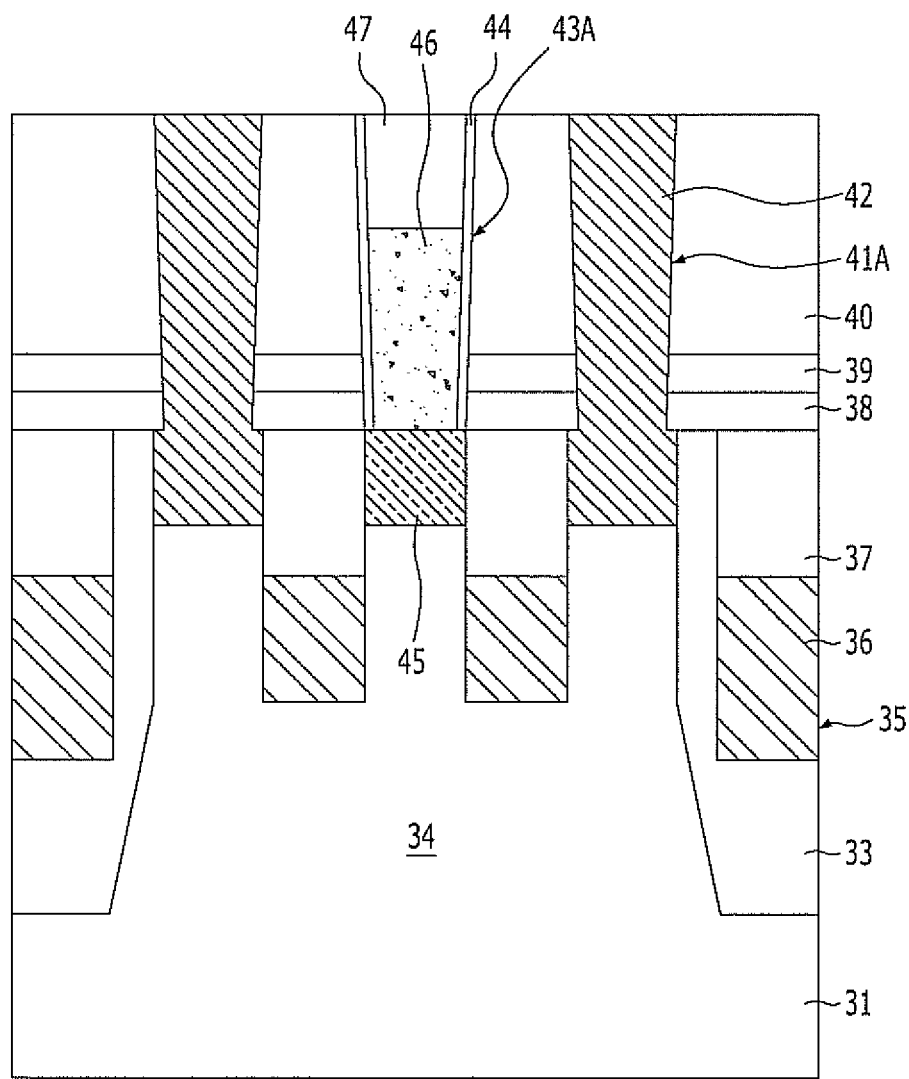

Referring to FIG. 2I, bit lines 46 filling a portion of the inside of the extended damascene pattern 43A are formed. The bit lines 46 may be formed of a metallic layer.

Subsequently, a sealing layer 47 filling the other portion of the inside of the extended damascene pattern 43A is formed over the bit lines 46.

The method for fabricating a semiconductor device in accordance with the first embodiment of the present invention, which is described above, may form the hard mask pattern 32 to have a low thickness H1 in the initial stage of forming the hard mask pattern 32 because the hard mask pattern 32 is removed after the storage node contact holes 41 and the damascene pattern 43 are formed. Through this method, the active regions 34 may be protected from leaning during a process of forming the isolation layer 33. Also, since the hard mask pattern 32 is removed after the storage node contact holes 41 and the damascene pattern 43A are formed, an increase in contact resistance resulting from the loss of landing plugs when the storage node contact holes 41 and the damascene pattern 43 are formed may be prevented. Also, since the hard mask pattern 32 remains under the storage node contact holes 41 when the storage node contact holes 41 are formed, a short circuit may be prevented from occurring between the adjacent active regions 34 and the storage node contact plugs 42.

FIGS. 3A to 3G are cross-sectional views illustrating a method for fabricating a semiconductor device with buried gates in accordance with a second embodiment of the present invention.

Figure 3A:
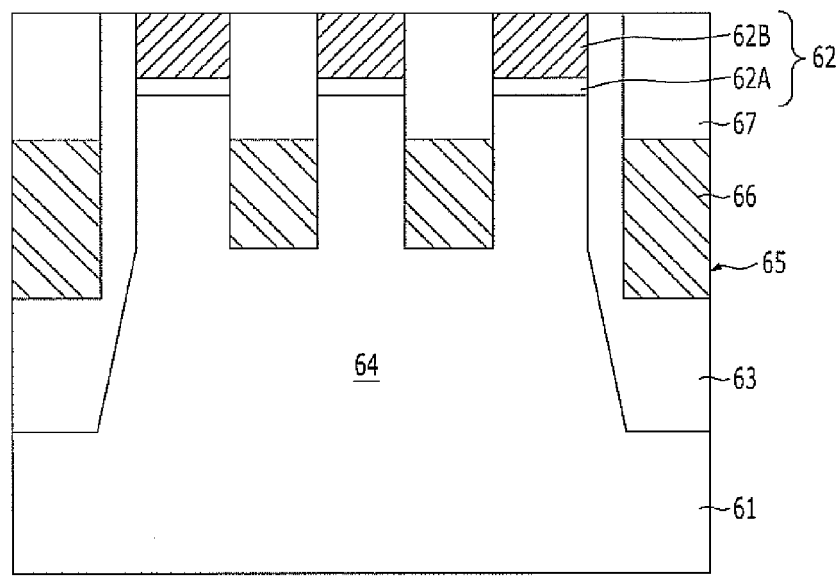

As illustrated in FIG. 3A, a first hard mask pattern 62 including a pad oxide layer 62A and a hard mask polysilicon layer 62B stacked therein is formed over a substrate 61. The hard mask polysilicon layer 62B substantially functions as an etch barrier, and the pad oxide layer 62A enhances the adhesion between the hard mask polysilicon layer 62B and the substrate 61, e.g., a silicon substrate. Here, when a polysilicon thin film is directly deposited on the silicon substrate, peeling of the polysilicon thin film may occur due to poor adhesion between the polysilicon thin film and the silicon substrate.

The first hard mask pattern 62 may be formed to have a thickness H1 to prevent active regions 64 from leaning during a subsequent process of forming isolation trenches. Moreover, the first hard mask pattern 62 may be formed to have a thickness H1 to prevent another active region 64 adjacent to storage node contact holes in the longitudinal direction of the active region 64 from being exposed during a subsequent process of forming storage node contact holes. For example, the first hard mask pattern 62 may be formed to have the thickness H1 ranging from approximately 600 Å to approximately 1500 Å.

Subsequently, isolation trenches for defining the active regions 64 are formed by using the hard mask pattern 62 as an etch barrier and etching the substrate 61, and then an isolation layer 63 is formed by filling the isolation trenches with an insulation material.

Subsequently, trenches 65 crossing the active regions 64 and the isolation layer 63 are simultaneously formed by selectively etching the first hard mask pattern 62, the active regions 64, and the isolation layer 63. Here, the trenches 65 may be formed as a line-type pattern.

Subsequently, a gate insulation layer (not shown) is formed on the surface of the trenches 65, and then a gate electrode 66 filling a portion of each trench 65 is formed. Here, the gate electrode 66 may be a metallic layer including a metal layer, a metal oxide layer, a metal nitride layer, and/or a metal silicide layer.

Subsequently, a sealing layer 67 is formed over the gate electrode 66 to fill the other portion of each trench 65, and then a planarization process is performed until the first hard mask pattern 62 is exposed.

Through the above-described process, buried gates including the trenches 65, the gate insulation layer (not shown), the gate electrode 66, and the sealing layer 67 may be formed. Here, the buried gates are formed in a cell region of the semiconductor device.

Figure 3B:
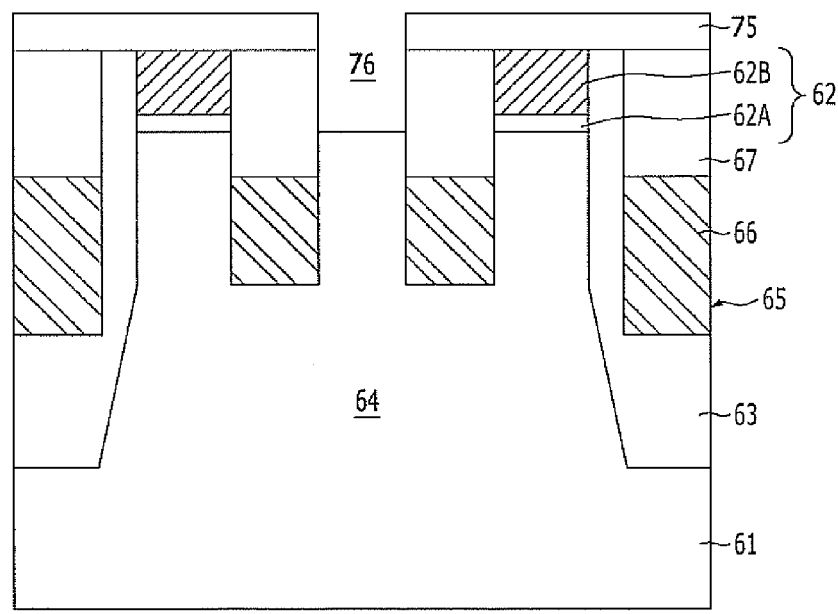

Referring to FIG. 3B, a second hard mask pattern 75 that exposes the first hard mask pattern 62 in a region where bit line contact plugs are to be formed is formed over the substrate 61. That is, the second hard mask pattern 75 exposes the first hard mask pattern 62 disposed in the central portion of the surface of the active regions 64.

Subsequently, bit line contact holes 76 that exposes the active regions 64 are formed by using the second hard mask pattern 75 as an etch barrier and removing the exposed first hard mask pattern 62. Here, when the first hard mask pattern 62 is removed, the pad oxide layer 62A and the hard mask polysilicon layer 62B may be removed individually to protect adjacent structures from being lost.

Figure 3C:
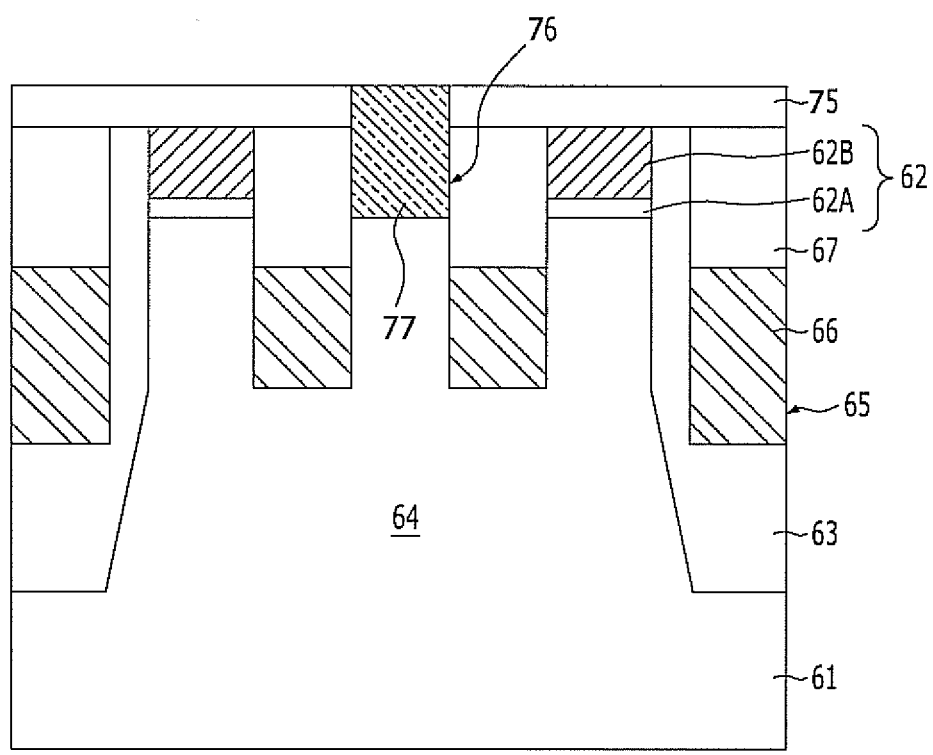

Referring to FIG. 3C, bit line contact plugs 77 are formed by filling the bit line contact holes 76 with a conductive material. The bit line contact plugs 77 may be formed of a silicon layer, and the silicon layer may include a polysilicon layer or an epitaxial silicon layer.

Subsequently, a planarization process is performed until the second hard mask pattern 75 is exposed. Here, the planarization process may be a Chemical Mechanical Polishing (CMP) process.

Figure 3D:
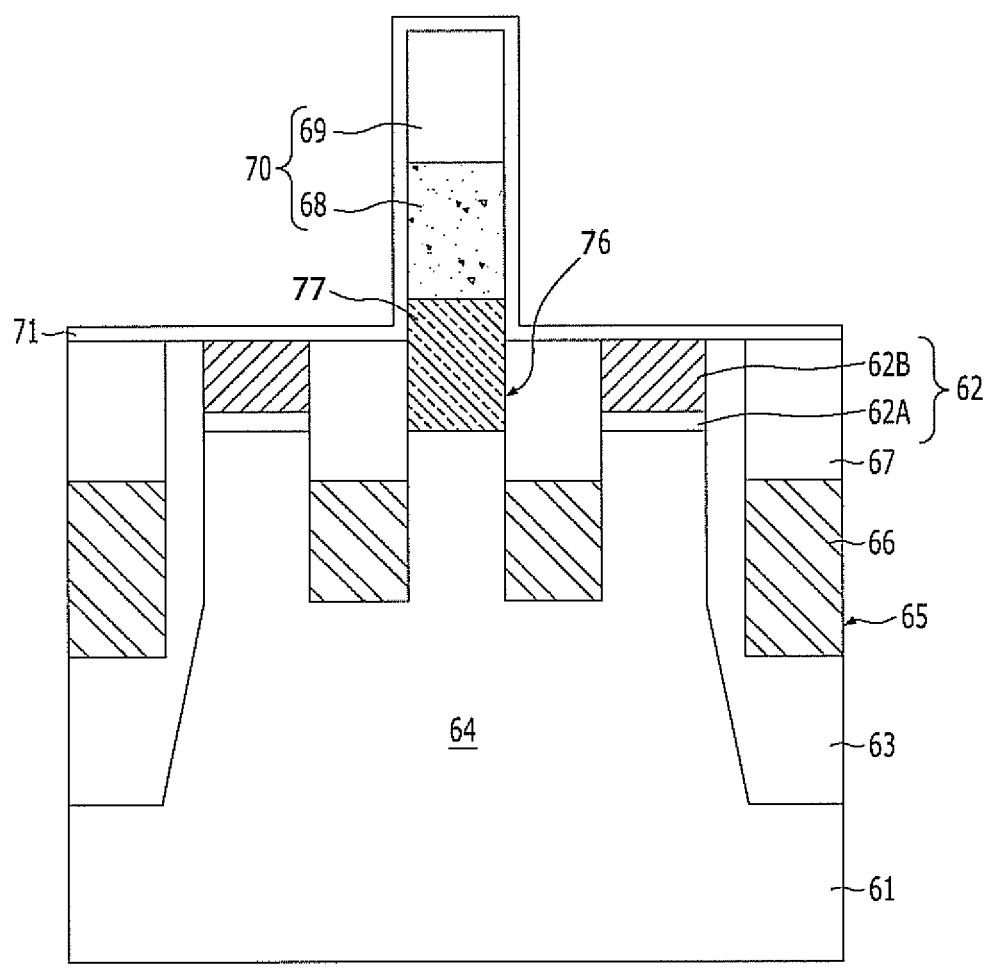

Referring to FIG. 3D, bit lines 70 are formed by sequentially forming a bit line-forming conductive layer 68 and a bit line hard mask layer 69 over the substrate 61 including the bit line contact plugs 77 already formed therein, and then selectively etching the bit line-forming conductive layer 68 and the bit line hard mask layer 69. Here, although not illustrated in the drawing, a peripheral gate may be formed in the peripheral region at the same time as the bit lines 70 are formed.

Subsequently, after the second hard mask pattern 75 is removed, a sealing layer 71 having a predetermined thickness is formed along the surface of the structure including the bit lines 70. The sealing layer 71 protects the bit lines 70 during a subsequent process, and the sealing layer 71 serves as an etch stop layer during a subsequent process of forming storage node contact holes.

Referring to FIG. 3E, an inter-layer dielectric layer 72 covering the bit lines 70 is formed over the sealing layer 71, and then a planarization process is performed until the bit line hard mask layer 69 is exposed. Here, the inter-layer dielectric layer 72 may be an oxide layer.

Subsequently, storage node contact holes 73 that expose the first hard mask pattern 62 are formed by sequentially etching the inter-layer dielectric layer 72 and the sealing layer 71. Here, since an over-etch process is performed to secure bottom CD and prevent the occurrence of "contact not open," a portion of the first hard mask pattern 62 may be lost.

The storage node contact holes 73 may be formed in any one shape selected from the group consisting of a hole type, a bar type, and a line type. Here, the bar type is a shape that exposes the upper portions of the edges of neighboring active regions 64 together.

Figure 3F:
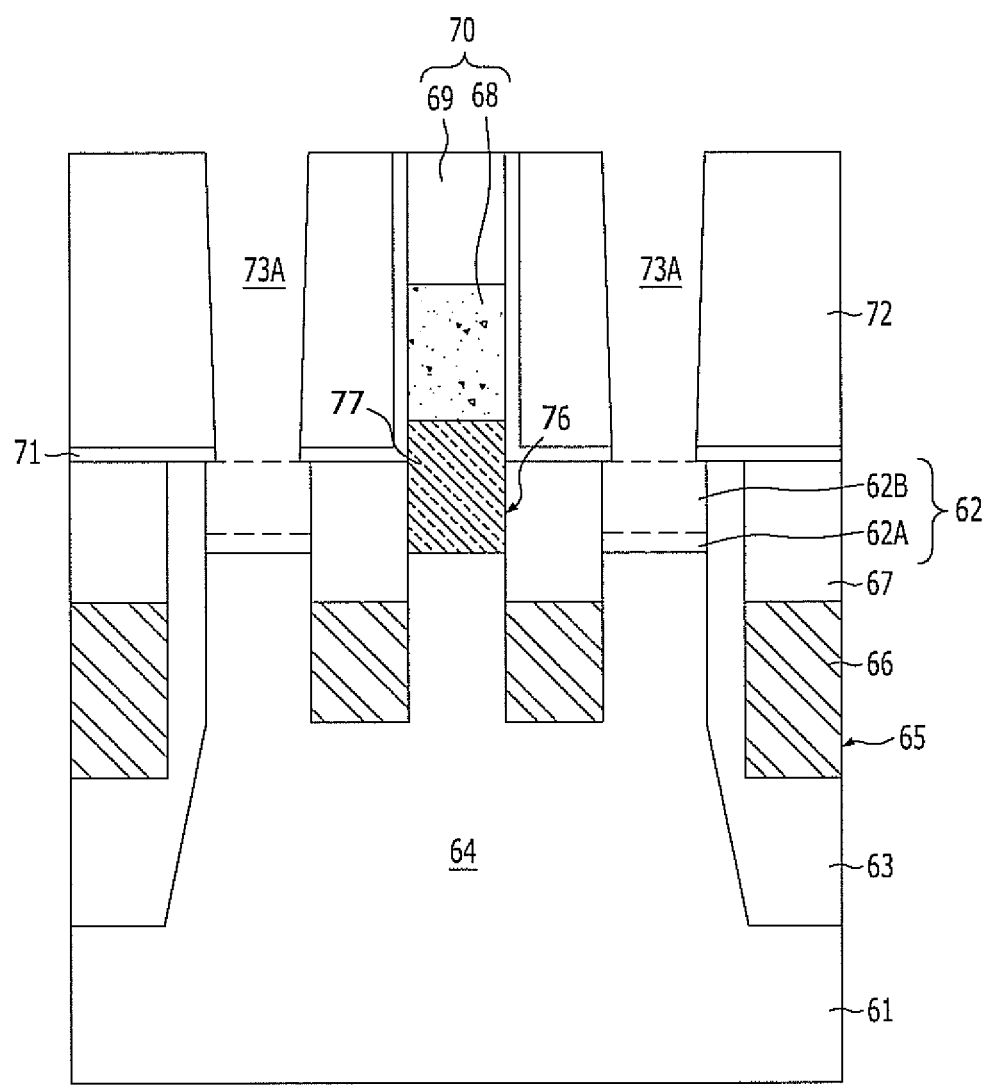

Referring to FIG. 3F, the active regions 64 are exposed by removing the first hard mask pattern 62 under the storage node contact holes 73. Here, when the first hard mask pattern 62 is removed, the pad oxide layer 62A and the hard mask polysilicon layer 62B may be removed individually to protect adjacent structures from being lost.

To be specific, the hard mask polysilicon layer 62B may be selectively removed through a dry etch process using a gas containing fluorine without damaging an adjacent structure. The pad oxide layer 62A may be removed through a dry etch process or a wet etch process. Here, when the pad oxide layer 62A is removed through a wet etch process, a protective layer (not shown) may be formed on the sidewalls of each storage node contact hole 73 in the form of spacers in order to prevent the sidewall of the storage node contact hole 73 from being deformed by an etch solution.

Hereafter, as the first hard mask pattern 62 under the storage node contact holes 73 is removed, the reference numeral of the extended storage node contact holes is denoted with '73A'.

Figure 3G:
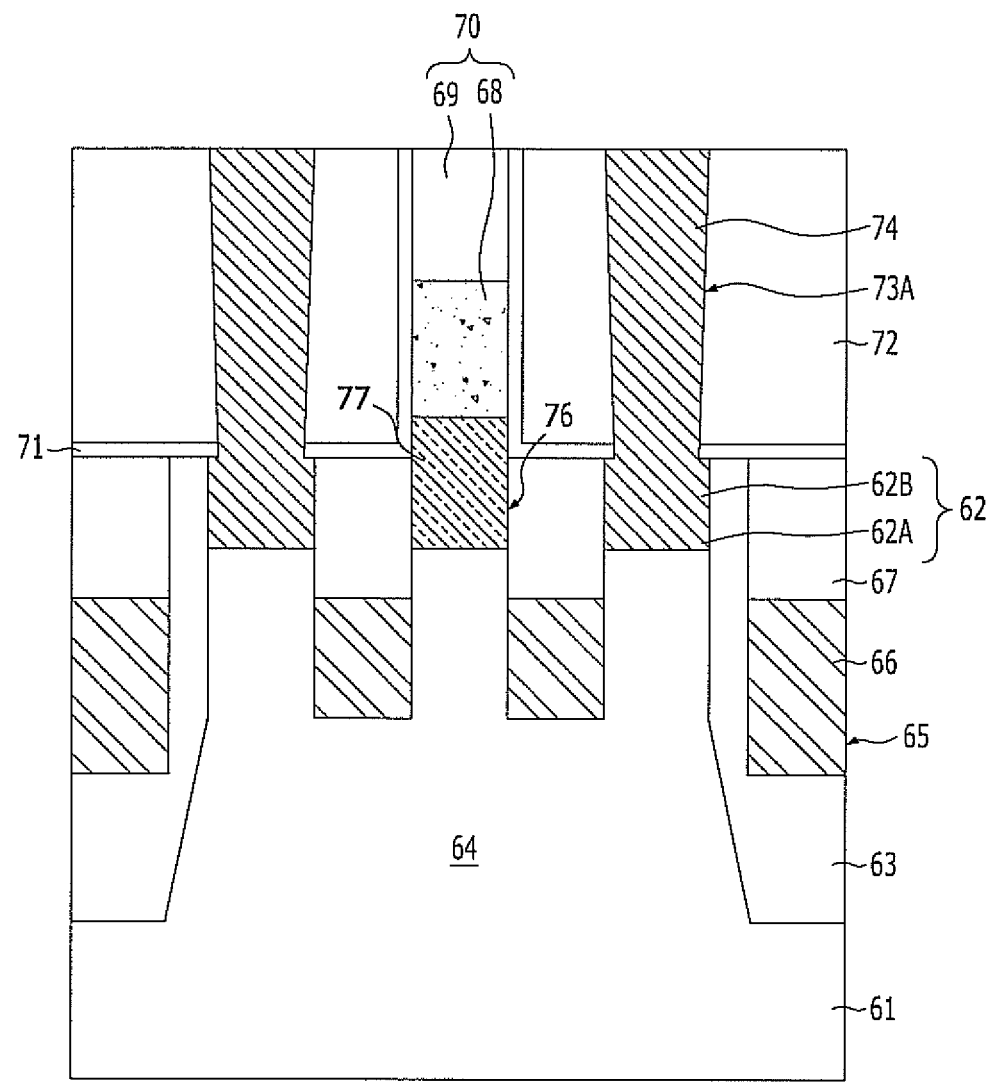

Referring to FIG. 3G, storage node contact plugs 74 having direct contact with the active regions 64 are formed by filling the extended storage node contact holes 73A with a conductive material. The storage node contact plugs 74 may be formed as a single layer by filling the extended storage node contact holes 73A with a silicon layer. Also, the storage node contact plugs 74 may be formed as a stacked layer by forming a silicon layer to fill a portion of each extended storage node contact hole 73A and then filling the other portion of the extended storage node contact hole 73A over the silicon layer with a metallic layer. Here, the silicon layer may be formed as a polysilicon layer or an epitaxial silicon (Si) layer through a Selective Epitaxial Growth (SEG) process.

The method for fabricating a semiconductor device in accordance with the second embodiment of the present invention, which is described above, may form the first hard mask pattern 62 to have a low thickness H1 in the initial stage of forming the first hard mask pattern 62 because the first hard mask pattern 62 is removed during the process of forming the extended storage node contact holes 73A and the bit line contact holes 76. Through this method, the active regions 64 may be protected from leaning during a process of forming the isolation layer 63. Also, since the first hard mask pattern 62 is removed during the process of forming the extended storage node contact holes 73A and the bit line contact holes 76, an increase in contact resistance resulting from the loss of landing plugs when the storage node contact holes and the bit line contact holes are formed may be prevented. Also, since the first hard mask pattern 62 remains under the storage node contact holes 73 when the storage node contact holes 73 are formed, a short circuit may be prevented from occurring between the adjacent active regions 64 and the storage node contact plugs 74.

According to an embodiment of the present invention, since a hard mask pattern is removed during the formation of storage node contact holes, damascene pattern, and bit line contact plugs, the hard mask pattern may be formed to have a thin thickness in the initial stage. In this way, the process margin for forming an isolation layer may be increased and active regions may be protected from leaning.

Also, since the hard mask pattern is removed during the formation of storage node contact holes, damascene pattern, and bit line contact plugs, contact resistance may be prevented from being increased by the loss of landing plugs during the formation process.

Moreover, since the hard mask pattern remains in the lower structure during the formation of the storage node contact holes, the occurrence of a short circuit between adjacent active regions and the storage node contact plugs may be prevented.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a hard mask pattern over a substrate;
   forming an isolation layer for defining an active region by using the hard mask pattern;
   forming a buried gate in and across the active region and the isolation layer over the substrate;
   forming an inter-layer dielectric layer over the substrate;
   forming a storage node contact hole that exposes the hard mask pattern by selectively etching the inter-layer dielectric layer;
   extending the storage node contact hole to expose the active region by removing the hard mask pattern exposed under the storage node contact hole; and
   forming a storage node contact plug that fills the extended storage node contact hole;
   forming a damascene pattern that exposes a remaining pattern of the hard mask pattern by selectively etching the inter-layer dielectric layer; and
   extending the damascene pattern to expose the active region by removing the remaining hard mask pattern exposed under the damascene pattern.

2. The method of claim 1, further comprising:
   forming bit line spacers on both sidewalls of the damascene pattern;
   sequentially forming a bit line contact plug and a bit line to fill a portion of the extended damascene pattern.

3. The method of claim 2, wherein the bit line contact plug is a polysilicon layer or an epitaxial silicon layer.

4. The method of claim 1, wherein the substrate comprises a cell region and a peripheral region, and the buried gate is formed in the cell region.

5. The method of claim 4, further comprising:
   forming a peripheral gate in the peripheral region before the forming of the inter-layer dielectric layer over the substrate.

6. The method of claim 1, wherein the forming of the buried gate comprises:
   forming a trench by selectively etching the hard mask pattern, the active region, and the isolation layer;
   forming a gate insulation layer on a surface of the trench;
   forming a gate electrode that fills a portion of the trench; and
   forming a sealing layer that fills the other portion of the trench.

7. The method of claim 1, wherein the storage node contact plug is formed as a single layer of a silicon layer or a stacked layer where a silicon layer and a metallic layer are stacked.

8. The method of claim 7, wherein the silicon layer is a polysilicon layer or an epitaxial silicon layer.

9. A method for fabricating a semiconductor device, comprising:
   forming a hard mask pattern over a substrate;
   forming an isolation layer for defining an active region by using the hard mask pattern;
   forming a buried gate in and across the active region and the isolation layer;
   forming a bit line contact hole by removing a first portion of the hard mask pattern;
   forming a bit line contact plug that fills the bit line contact hole; and
   forming a bit line over the bit line contact plug.

10. The method of claim 9, further comprising:
    forming an inter-layer dielectric layer that covers the bit line over the substrate;
    forming storage node contact hole that exposes a second portion of the hard mask pattern by selectively etching the inter-layer dielectric layer;
    extending the storage node contact hole to expose the active region by removing the second portion of the hard mask pattern exposed under the storage node contact hole; and
    forming a storage node contact plug that fills the extended storage node contact hole.

11. The method of claim 10, further comprising:
    forming a protective layer on sidewalls of the storage node contact hole, before the extending of the storage node contact hole.

12. The method of claim 10, wherein the storage node contact plug is formed as a single layer of a silicon layer or a stacked layer where a silicon layer and a metallic layer are stacked.

13. The method of claim 12, wherein the silicon layer is a polysilicon layer or an epitaxial silicon layer.

14. The method of claim 9, wherein the substrate comprises a cell region and a peripheral region, and the buried gate is formed in the cell region.

15. The method of claim 14, the forming of the bit line over the bit line contact plug comprising:
    forming a peripheral gate in the peripheral region.

16. The method of claim 9, wherein the bit line contact plug is a polysilicon layer or an epitaxial silicon layer.

17. The method of claim 9, wherein the forming of the buried gate comprises:
    forming a trench by selectively etching the hard mask pattern, the active region, and the isolation layer;
    forming a gate insulation layer on a surface of the trench;
    forming a gate electrode that fills a portion of the trench; and
    forming a sealing layer that fills the other portion of the trench.

* * * * *